United States Patent
Smith et al.

[11] Patent Number: 5,994,222
[45] Date of Patent: Nov. 30, 1999

[54] METHOD OF MAKING CHIP MOUNTINGS AND ASSEMBLIES

[75] Inventors: John W. Smith, Palo Alto; Thomas H. DiStefano, Monte Sereno, both of Calif.

[73] Assignee: Tessera, Inc, San Jose, Calif.

[21] Appl. No.: 08/845,786

[22] Filed: Apr. 25, 1997

Related U.S. Application Data

[62] Continuation-in-part of application No. 08/695,875, Aug. 13, 1996, and application No. 08/374,559, filed as application No. PCT/US93/06930, Jul. 23, 1993, Pat. No. 5,915,752, which is a continuation-in-part of application No. 07/919,772, Jul. 24, 1992, abandoned, said application No. 08/695,875, is a division of application No. 08/516,290, Aug. 17, 1995, Pat. No. 5,787,581, which is a division of application No. 08/268,040, Jun. 29, 1994, Pat. No. 5,489,749, which is a division of application No. 07/919,772

[60] Provisional application No. 60/021,479, Jul. 3, 1996, and provisional application No. 60/014,718, Jun. 24, 1996.

[51] Int. Cl.$^6$ .................................................... H01L 21/00
[52] U.S. Cl. ........................... 438/689; 216/14; 216/41; 257/735; 438/611; 438/123
[58] Field of Search ....................... 216/14, 41; 438/123, 438/611, 689; 257/690, 735, 736

[56] References Cited

U.S. PATENT DOCUMENTS

| | | |
|---|---|---|
| 3,689,991 | 9/1972 | Aird . |
| 3,777,365 | 12/1973 | Umbaugh . |
| 4,049,903 | 9/1977 | Kobler . |
| 4,141,712 | 2/1979 | Rogers . |
| 4,380,042 | 4/1983 | Angelucci, Sr. et al. . |
| 4,547,795 | 10/1985 | Wulff . |
| 4,756,080 | 7/1988 | Thorp, Jr. et al. . |
| 4,772,936 | 9/1988 | Reding et al. . |
| 4,801,999 | 1/1989 | Hayward et al. . |
| 4,812,421 | 3/1989 | Jung et al. . |
| 4,842,662 | 6/1989 | Jacobi . |
| 4,967,261 | 10/1990 | Niki et al. . |
| 4,975,765 | 12/1990 | Ackermann et al. . |
| 5,177,863 | 1/1993 | Lam . |
| 5,390,844 | 2/1995 | DiStefano et al. . |
| 5,398,863 | 3/1995 | Grube et al. . |
| 5,489,749 | 2/1996 | DiStefano et al. . |
| 5,491,301 | 2/1996 | DiStefano et al. . |
| 5,536,909 | 7/1996 | DiStefano et al. . |
| 5,597,470 | 1/1997 | Karavakis et al. . |
| 5,659,952 | 8/1997 | Kovac et al. . |

FOREIGN PATENT DOCUMENTS

WO 94/03036  2/1994  WIPO .

*Primary Examiner*—William Powell
*Attorney, Agent, or Firm*—Lerner, David, Littenberg, Krumholz & Mentlik, LLP

[57] ABSTRACT

A bonding component for electrically connecting a semiconductor chip or wafer to a support substrate includes a dielectric layer having a central region, elongated slots defining the central region, and a peripheral region surrounding the slots. Metallic bonding pads are arranged on the central region, and leads extend from the bonding pads to the edge of the central region and extending partially across the elongated slots. The leads are detached from the peripheral region of the dielectric layer on the side of the slots opposite the central region. The leads are adapted to be deformed during bonding to a semiconductor chip or wafer. To form the bonding component, a dielectric layer is first provided having a central region, slots and a peripheral region. A metallic structure is also provided having bonding pads on the central region, and leads electrically connected to the bonding pads and to a plating bus disposed in the peripheral region. A resist is applied to the metallic structure in zones separating the leads, the metallic structure is plated in regions outside the zones with an etch resistant metal, the resist is removed and the leads are etched so as to form gaps in the metallic structure over the elongated slots.

25 Claims, 7 Drawing Sheets

METHOD OF MAKING CHIP MOUNTINGS AND ASSEMBLIES

CROSS REFERENCE TO RELATED APPLICATIONS

The present application claims benefit of U.S. Provisional Applications No. 60/021,479, filed Jul. 3, 1996, and No. 60/014,718, filed Jun. 24, 1996, the disclosures of which are incorporated by reference herein. The present application is also a continuation in part of U.S. patent application Ser. No. 08/695,875, filed Aug. 13, 1996, which in turn is a divisional of U.S. patent application Ser. No. 08/516,290 filed Aug. 17, 1995, now U.S. Pat. No. 5,787,581, which in turn is a divisional of a U.S. Application Ser. No. 08/268,040, filed Jun. 29, 1994, now U.S. Pat. No. 5,489,749, which in turn is divisional of U.S. patent application Ser. No. 07/919,772 filed Jul. 24, 1992 now abandoned. The present application is also a continuation in part of U.S. patent application Ser. No. 08/374,559 filed May 8, 1995, now U.S. Pat. No. 5,915,752 and filed Jul. 23, 1993 as PCT US/93/06930, which in turn is a continuation in part of said U.S. patent application Ser. No. 07/919,772.

FIELD OF THE INVENTION

The present invention relates to components and methods used in mounting and connecting microelectronic elements such as semiconductor chips.

BACKGROUND OF THE INVENTION

Semiconductor chips and other microelectronic elements typically have contacts which must be connected to external circuitry, such as the circuitry of a supporting substrate or circuit panel. Various processes and components for making these connections have been provided heretofore. For example, in a wire bonded assembly the chip is physically mounted on a substrate and individual fine wires are connected between the contacts of the chips and contact pads on the substrate. In tape automated bonding or "TAB" processes, a dielectric supporting tape such as a thin foil of a polymer is provided with a hole slightly larger than the chip. An array of metallic leads is provided on one surface of the dielectric tape. These leads extend inwardly from around the hole so that an inner end of each lead projects inwardly beyond the edge of the hole. These ends are arranged side by side at spacings corresponding to the spacings of the contacts on the chip. The inner ends of the leads are bonded to the contacts on the chip, whereas outer ends of the leads are attached to contact pads on the substrate. In the "beam lead" process, the chip is provided with leads extending from contacts on the chip outwardly beyond the edges of the chip. The chip is positioned on the substrate so that the outer ends of the leads lie over the appropriate contact pads of the substrate and the leads are bonded to the contact pads.

The rapid evolution of the semiconductor art has created a need for progressively greater numbers of contacts and leads in a given amount of space. An individual chip may require hundreds or even thousands of contacts and leads. For example, a complex semiconductor chip in current practice may have rows of contacts spaced apart from one another at center-to-center distances of 0.5 mm or less. These distances are decreasing progressively with continued progress in the semiconductor art. With such closely spaced contacts, the leads connected to the chip contacts such as the wires in wire bonding and the leads used in the TAB and beam lead processes must be extremely fine structures, typically less than 0.1 mm wide.

As disclosed, for example, in U.S. Pat. Nos. 5,489,749 and 5,536,909 and in PCT Published International Application WO 94/03036, published Feb. 3, 1994, all of which are incorporated by reference herein, a component for mounting a semiconductor chip may include a support structure such as a polymeric film defining one or more slots and one or more leads extending across such slots. The support structure typically has terminals on it for connection to a circuit panel or external circuitry. Each lead has a connection section with a first end permanently secured to the supporting structure on one side of the slot and a second end remote from the first end. The first ends of the lead connection sections typically are connected to the terminals. The second end of each connection section is releasably secured to the opposite side of the slot. For example, each lead may include a frangible section connecting the second end of the connection section to the support structure. Thus, each lead bridges across the slot in the support structure.

Each lead is then engaged by a bonding tool which enters the slot and forces each lead downwardly into engagement with the appropriate contact of the chip. This motion releases the lead from the side of the slot opposite the terminals. For example, the frangible section of the lead may be severed by the downward movement of the lead. Preferably, each lead is guided by the bonding tool during this operation. When the leads are bonded to the contacts of the chip, the terminals on the supporting structure are electrically connected to the chip. Thus, the chip can be connected to external circuitry by attaching the terminals on the supporting structure to a larger substrate, as by solder bonding the terminals to the larger substrate. The bonded leads typically provide flexible interconnections between the contacts of the chip and the terminals and thus allow compensation for thermal expansion and contraction of the chip and substrate. Components and bonding methods as disclosed in the '749 and '909 patents and in the '036 International Publication provide rugged, compact and economical chip mountings, and offer numerous advantages. Still further improvements and enhancements to such chip mountings are disclosed in U.S. Pat. No. 5,398,863 and U.S. Pat. No. 5,491,302, the disclosures of which are hereby also incorporated by reference herein. Bonding tools useful in attaching leads according to the '794 patent and '036 publication and for other purposes are disclosed in U.S. Pat. No. 5,390,844 and U.S. patent application Ser. No. 08/630, 375, filed Apr. 10, 1996, now U.S. Pat. No. 5,868,301, the disclosures of which are also incorporated by reference herein.

U.S. patent application Ser. No. 08/491,809, filed Jun. 16, 1995, now U.S. Pat. No. 5,597,470, and Ser. No. 08/374, 559, filed May 8, 1995, now U.S. Pat. No. 5,915,752, disclose metallic buses that are formed on the support structure, extending parallel to the slot and perpendicular to the leads, on the side of the slot opposite the terminals. The leads are each electrically and mechanically connected to the bus. The metallic bus is used for providing current to the leads and terminals during a plating process. For example, the terminals and leads may be plated with a bondable cover material such a gold, silver, platinum, palladium and alloys thereof, using the bus to provide current during the plating process. After the plating process is completed, the leads are mechanically severed from the plating buses during the process of bonding the leads to the chip. As the lead is displaced downward through the slot and into contact with a terminal on the chip, a frangible portion of the lead near the side of the slot where the leads connect to the plating buses is broken, disconnecting the lead from the support structure on that side of the slot and electrically severing the lead from the plating bus. The lead may be displaced downward using a specially configured bonding tool.

The '809 application discloses a preferred embodiment in which the leads are severed from the plating bus one at a time. In this process, a bonding tool displaces each lead downward and bonds it to a terminal on the semiconductor chip before advancing to the next lead. In this way, each lead is connected to either the plating bus or the semiconductor chip except the lead actually undergoing the bonding process.

In some cases, the manufacturer performing the lead bonding operation does not wish to detach the lead from the supporting structure, as by breaking a frangible section of the lead, during the bonding operation. In this case, it would be desirable to provide cantilevered leads extending partially across the bonding slots, with free ends available for downward displacement and bonding. However, it has not been practical heretofore to provide such free ends on leads arranged to form a "fan-in" chip mounting, in which the contacts on the chip are arranged at the periphery of the chip and the terminals mounted on a dielectric structure and connected to the leads are disposed overlie the center of the chip.

SUMMARY OF THE INVENTION

The present invention addresses these needs.

In one aspect of the invention, a bonding component for making semiconductor assemblies includes a dielectric layer having at least one slot with first and second longitudinal edges. A plurality of terminals are disposed on the dielectric layer. A plurality of leads extend from the terminals, each of the leads extending to one of the first and second edges of the slot. These leads then extend partially across the slot so that each lead is detached from the other of the edges of the slot and is deformable by bending the lead out of a plane of the dielectric layer.

In another aspect of the invention, a bonding component for making semiconductor assemblies includes a dielectric layer having a plurality of slots surrounding a central region, and a peripheral region disposed outside the slots. Bridges integral with the dielectric layer connect the central region to the peripheral region. A plurality of terminals are disposed on the central region, and leads extend from the terminals to the slots, and extend partially across the slots so that each lead is detached from the peripheral region. The leads are deformable by bending out of a plane of the dielectric layer.

In another aspect of the invention, a bonding tape for making a plurality of semiconductor assemblies includes a dielectric layer having a plurality of units, each unit including a plurality of slots in the dielectric layer surrounding a central region, and a peripheral region disposed outside the slots. Bridges integral with the dielectric layer connect the central region to the peripheral region. Each unit further has a plurality of terminals disposed on the central region. Leads extend from the terminals to the slots and extend partially across the slots so that each lead is detached from the peripheral region. The leads are deformable out of a plane of the dielectric layer. The dielectric layer may be in the form of an elongated strip wherein the units are spaced apart from one another along the length of the strip.

In a further aspect of the invention, a method is provided for making a connection component for a semiconductor assembly. A dielectric layer is first provided having a central region, one or more slots disposed adjacent the central region and a peripheral region disposed adjacent the slots opposite the central region. A metallic structure is also provided having a plurality of terminals that are disposed on the central region and one or more plating bus runs disposed on the peripheral region. The metallic structure further has leads extending from the terminals to the plating bus runs. A photoresist is applied to the leads in zones adjacent the plating bus runs, and the leads are then plated in regions outside the zones with an etch resistant metal. The photoresist is then removed and the leads are etched to form breaks in the leads. The steps of forming the slots, applying the resist and etching may be performed so that the gaps in the leads are aligned with the slots. The slots in the dielectric layer may surround the central region, and the dielectric layer may have bridges disposed between the slots connecting the central region to the peripheral region. Furthermore, the plating bus may run alongside the slots.

In preferred processes according to this aspect of the invention, the plating bus can convey plating currents to all of the leads during the lead-forming steps, and each lead is detached from the bus by etching to form the breaks.

The dielectric layer may include a plurality of units, wherein each unit includes a central region and a peripheral region, and the metallic structure includes terminals on the central region of each of the units, leads associated with terminals of each of the units and one or more plating bus runs on the peripheral region of each unit. The plating bus runs on the peripheral regions of the plural units may be connected to one another and the plating step may thereby be performed on the plurality of units simultaneously.

In a further embodiment of the invention, a method for forming a semiconductor connection component includes the steps of providing a dielectric layer having a slot, and providing a metallic structure including terminals disposed on the dielectric layer on one side of the slot, a plating bus line disposed on the other side of the slot, and leads extending from the terminals across the slots to the plating bus. The leads are plated with a bonding material using the plating bus to conduct plating current to the leads. The bonding material is deposited on at least portions of the lead aligned with the slot. After plating, each of the leads is severed from the plating bus and then bonded to a contact on a chip. This method may further comprise the step of applying a resist to the leads adjacent the plating bus before the step of plating the leads. In that case, a part of each lead adjacent the plating bus will be left unplated with the bonding material, and the severing step includes the step of etching the leads to form breaks in the unplated portions.

DETAILED DESCRIPTION OF THE PREFERRED EMBODIMENT

Figure 1:
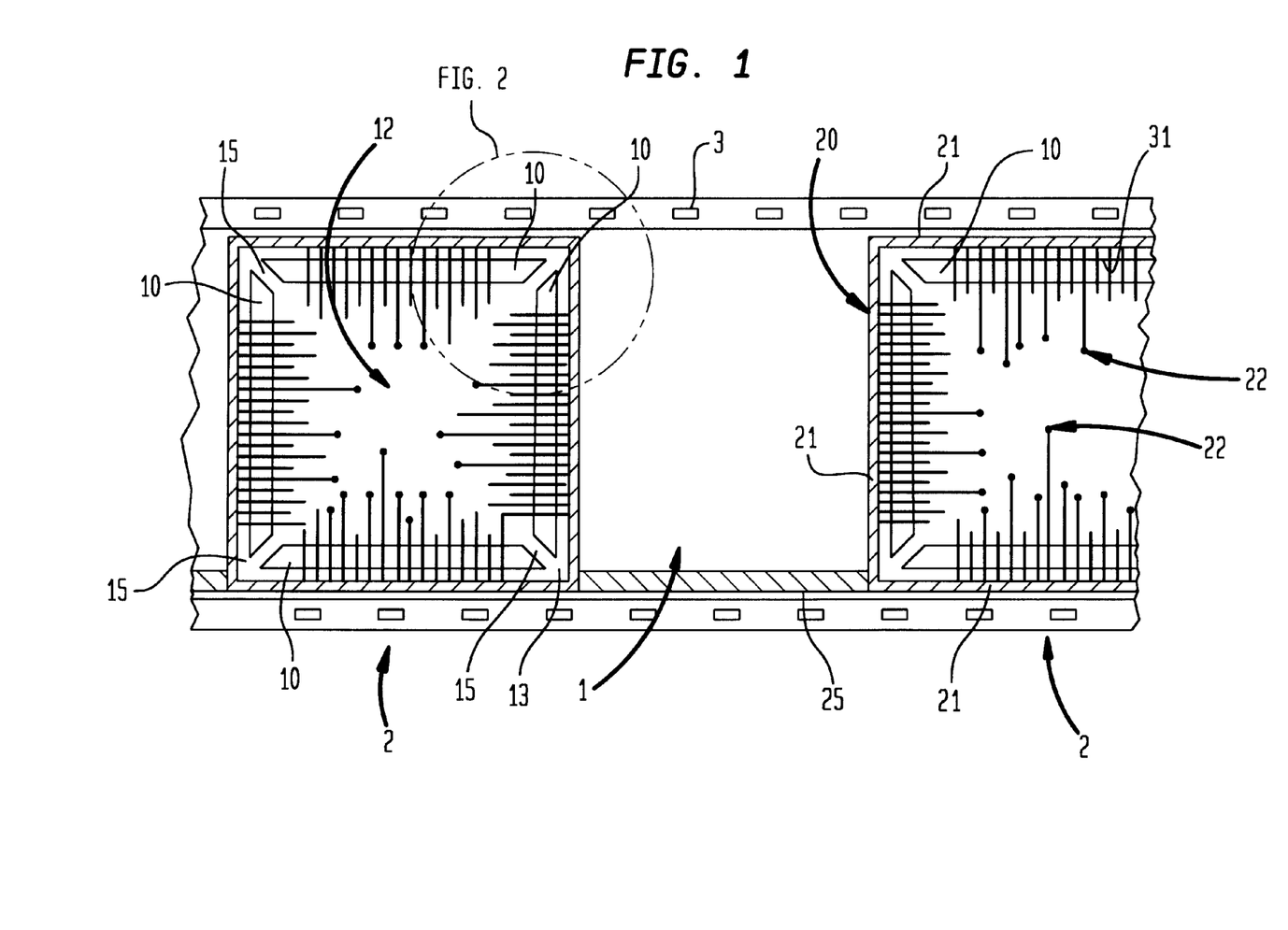
FIG. 1 is a partial plan view of a bonding tape according to one embodiment of the invention showing a bonding component unit and a partial additional bonding component unit on the tape.

A bonding tape 1 for making a plurality of semiconductor assemblies in accordance with one embodiment of the invention has a series of units 2 spaced along the length of the tape (FIG. 1). The tape 1 comprises a dielectric substrate such as a thin, flexible layer of polyimide or other suitable polymer. Typically, the polyimide layer is about 15 microns to about 40 microns thick. Each of the units 2 is used to form a single mounting component for a semiconductor chip. The tape 1 may have sprockets 3 for indexing and guiding the tape through various manufacturing steps as described below.

Each unit 2 on the tape 1 includes a central region 12 bounded at least in part by elongated slots 10, alternatively referred to herein as bond windows 10. The slots 10, in turn, are bounded on their outside edge 31 by a peripheral region 13 of the tape. The central region 12 is connected to the peripheral region 13 by bridges 15 extending across or between the elongated slots 10. Typically, the central region 12, the bridges 15 and the peripheral region 13 are all formed from a single sheet of dielectric material. Alternatively, the bridges 15 may be "holding straps" that are photolithographically defined from the copper sheet 20 discussed below. The elongated slots 10 may be formed by etching, laser ablation, punching or other process suitable for removing the dielectric material. By leaving bridges 15 of dielectric material spaced about the central region, the central region 12 is supported and maintained in place with respect to the other components of the tape 1. The elongated slots 10 may be formed in the tape either before or after the metallic structure 20, discussed below, is applied.

A unitary metallic structure 20 is applied to a top surface of the tape 1. The term "top surface" as used herein will refer to that surface of the dielectric tape upon which the metallic structure is or will be formed. The metallic structure may be formed from copper or other suitable metal. A preferred thickness of a copper metallic structure is between about 10 and 25 microns thick; a most preferred thickness is about 18 microns thick.

Figure 2:
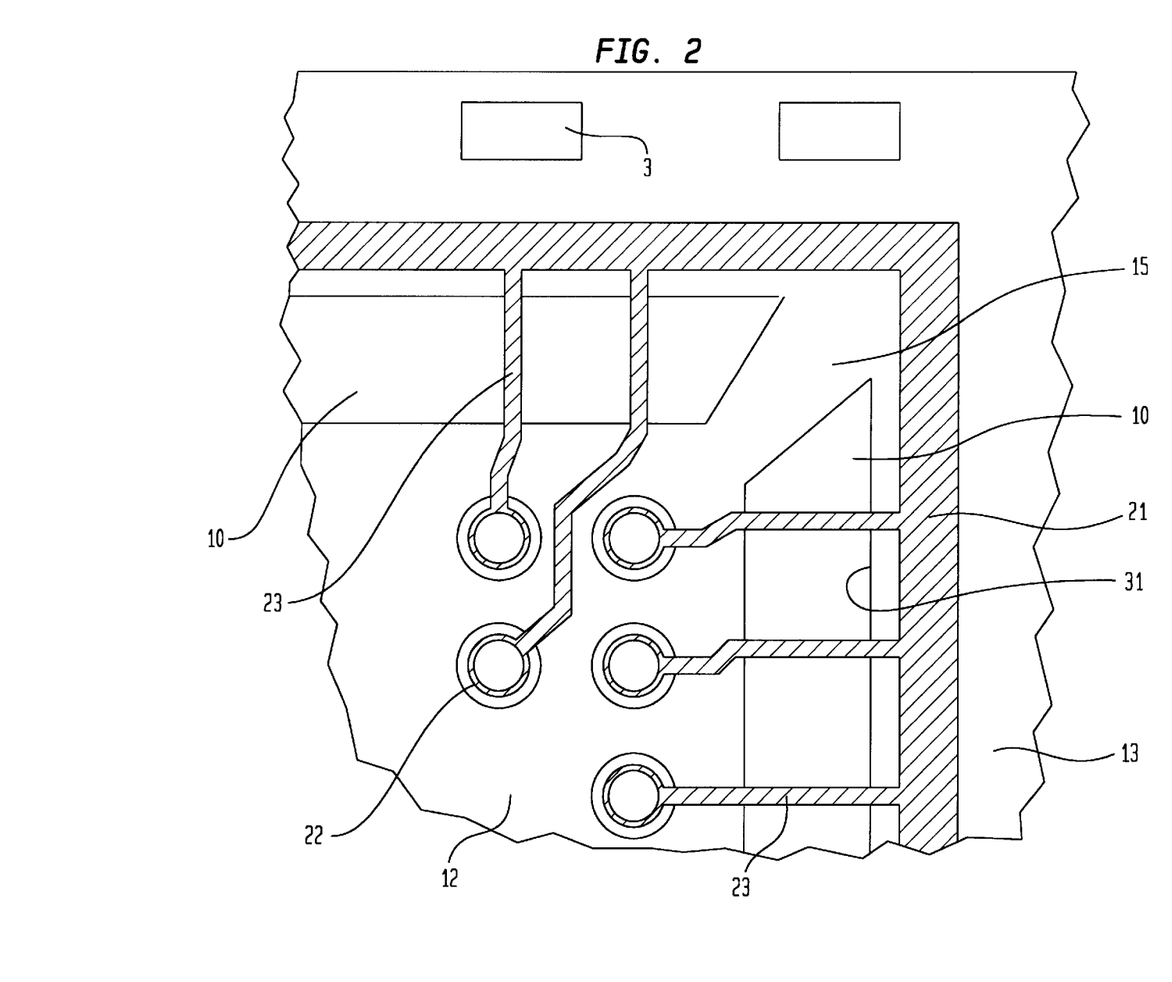
FIG. 2 is a fragmentary plan view on an enlarged scale depicting Area II of the bonding tape shown in FIG. 1, during one step of a manufacturing process according to an embodiment of the invention.

The metallic structure comprises numerous terminals or pads 22 located within the central region 12 of each unit. The terminals 22 correspond in location to terminals on a circuit board (not shown) or other supporting structure having external circuitry to which a semiconductor chip is to be mounted using the bonding component of the invention. Each of the terminals 22 is connected to a lead 23 that extends from the terminal to the edge of the central region 12. Because some semiconductor chips require hundreds or even thousands of such terminals to interconnect with external circuitry, the terminals 22 may be closely arranged within the central region 12 with the leads 23 routed between the terminals to reach the edge of the central region 12. Alternatively, the leads may be routed in multiple layers separated from one another by one or more layers of dielectric material incorporated in the tape. The enlarged view shown in FIG. 2 includes several terminals 22 and leads 23. In actual practice, however, there may be hundreds of even thousands of such terminals.

Buses 21, additional elements of the metallic structure 20, run parallel to the elongated slots 10 in the peripheral region 13 of the dielectric material. At the stage of manufacture illustrated in FIGS. 1 and 2, the leads continue from the edge of the central region 12 across the elongated slots 10 to the peripheral region 13 of the dielectric material. Each of the leads 23 spans an elongated gap 10 and enters the peripheral region 13 at the outside edge 31 of the gap. Each lead 23 joins one of the buses 21 in a direction perpendicular to the bus. Thus, the leads form a series of bridges spanning and running transverse to the elongated slots 10.

The metallic structure 20 may be formed by conventional additive or subtractive processes. For example, a layer of copper may be laminated to the top surface of the tape 1 using an adhesive. The copper layer is then masked using conventional photoresist or other processes and is etched to leave the metallic structure including the terminals, leads and buses. After the copper layer has been etched, the resist is removed, exposing the copper metallic structure on the top surface of the tape 1.

The buses 21 extend in the peripheral region 13 along each of the elongated slots 10. The buses are preferably interconnected at the corners of the units 2, thereby electrically connecting each the buses 21 within a unit 2. Because each of the terminals 22 is connected to a bus 21 through a lead 23, all the terminals and leads within a unit 2 are initially electrically interconnected. In addition, supplemental buses 25 may be run between the units 2, electrically interconnecting buses among the units 2. In this way, the entire metallic structure of a tape 1 may be electrically connected together at the initial stages of the process.

In the next stage of manufacture, a dielectric plating resist 30 (FIG. 3) is applied to each lead 23 in a region near the peripheral region 13 and near the outside edge 31 of the elongated slot 10. The resist 30 extends along the lead 23 at least partially into the region bridging the elongated slot 10. The resist 30 may be applied using photographic or other techniques, and prevents electroplating of metals on the metallic structure 20.

Figure 3:
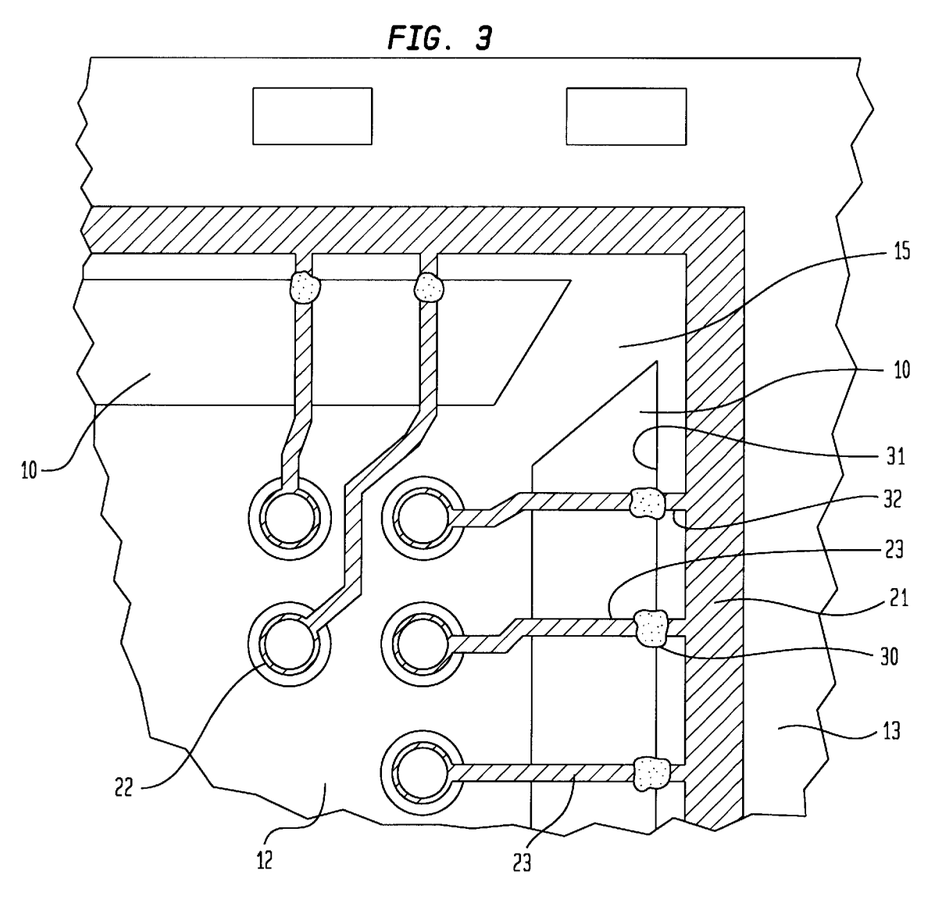
FIG. 3 is a view similar to FIG. 2 but depicting the component during a later step in the manufacturing process.

The plating resist 30 may be restricted to a small area on each lead 23 adjacent the outside edge 31, as shown in FIG. 3. Alternatively, the plating resist may cover the remaining portion 32 of the lead 23, extending outwardly to the plating bus, and may additionally cover the plating bus 21. As explained below, by utilizing a plating resist on these additional features, the quantity of plating material that must be reclaimed after the process is performed is reduced.

Figure 5:
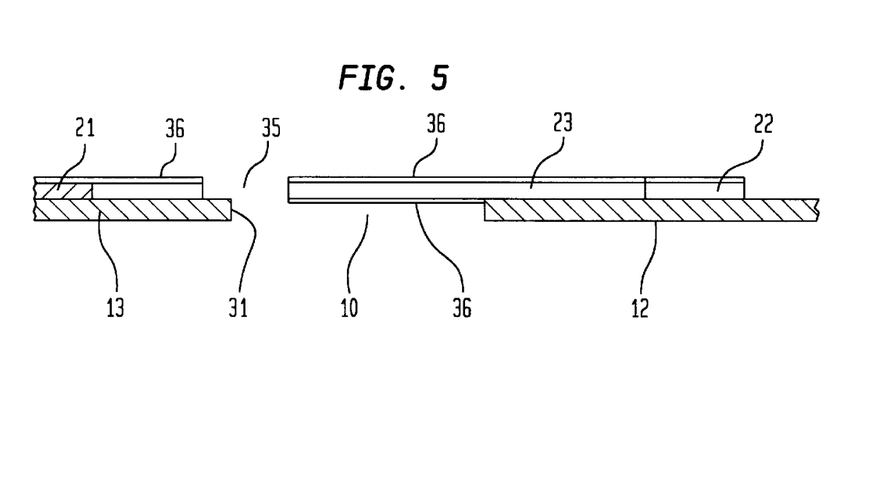
FIG. 5 is a partial sectional view of the bonding component of FIGS. 1–4 prior to bonding.

That portion of the metallic structure not covered with resist is then plated with one or more metals which form a etch-resistant, bondable covering 36 (FIG. 5). Preferably, the plating buses 21 (FIG. 3), as well as the interconnecting plating bus 25, are used to provide a plating current to the terminals 22 and the leads 23 of large portions of the tape 1 simultaneously. The preferred bondable plating material is gold about 0.5 to about 3 microns thick. In addition, a layer of nickel or other barrier metal adapted to retard diffusion mixing of gold and copper may be provided between the gold and copper layers. The leads are preferably plated completely around the exposed leads, but at least on the bottom surface with plating metal 36 (FIG. 5). In the region of the lead 23 where the resist 30 has been applied, no plating metal is deposited. There is therefore formed a gap in the etch-resistant, bondable covering 36 on the leads near the outside edge 31 of the elongated grooves.

After features of the unitary metallic structure 20 have been plated, the plating resist 30 is removed, leaving exposed copper in the areas formerly covered by the plating resist. The metallic structure is then etched to remove the exposed copper. The plated metal serves as an etching resist, so that regions of the leads covered by the plated metal are not removed in the etching process. The etching process forms gaps 35 (FIG. 4) in the leads 23 near the outer edges 31 of the slots 10. Alternatively, in a process wherein the buses 21 are covered with resist and therefore not plated, those features are also removed or partially removed during the etching process. The leads 23 remaining after the etching process are cantilevered from the central region 12 outward partially across the elongated slots 10, and are detached from the peripheral region 13. In this state, the leads are deformable by bending out of the plane of the dielectric tape 1 for the purpose of bonding to a semiconductor chip (not shown).

Figure 4:
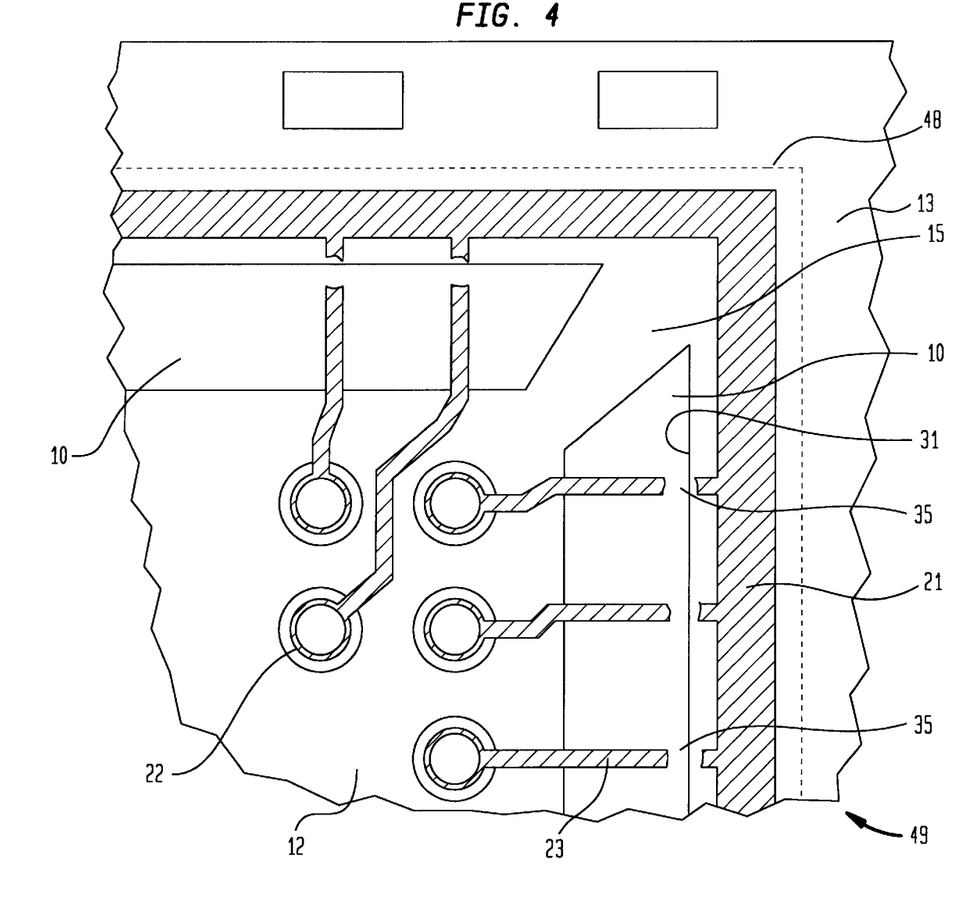
FIG. 4 is a view similar to FIG. 2 but depicting the component during a later step in the manufacturing process.

The resulting tape has individual units, each electrically isolated from the other due to the removal by etching of at least an outside portion of each lead 23 to form gaps 35. The central region 12 of the dielectric tape 1 is suspended and maintained in position with respect to the peripheral region 13 of the tape by bridges 15 (FIG. 4). The leads 23 extend outwardly from the central region 12, in a plane defined by the top surface of the tape, and partially across the slots 10 which now comprise bonding windows.

Bridges 15 may be an integral part of the dielectric tape, as shown in FIG. 4, or may comprise a portion of the metallic structure 20, as noted above. In one embodiment, the bridge 15 is an extension (not shown) of the bus 21 protruding inwardly across a corner formed by two elongated slots 10. The bridge is attached to a small portion of the central region 12 and serves to support the central region after gaps 35 (FIG. 4) are formed in the leads 23.

The resulting bonding component 49 (FIG. 4) thus comprises a dielectric layer 1 having a plurality of slots 10 surrounding a central region 12, a peripheral region 13 disposed outside of the slots, and bridges 15 integral with the dielectric layer connecting the central region 12 to the peripheral region 13. A plurality of terminals 22 on the central region 12 are connected to leads 23 extending from terminals to the slots 10. The leads 23 extend partially across the slots 10 so that each lead is detached from the peripheral region 13.

The individual bonding component units 2 may be bonded to microelectronic components such as semiconductor chips. The semiconductor chip 40 (FIG. 6) is placed beneath the central region 12 of one of the units 2 of the bonding tape 1. In a preferred embodiment, a compliant layer 42, such an elastomeric pad, is disposed between the central region 12 and the semiconductor element 40 before the bonding process. The compliant layer 42 may be provided on the tape 1 before or after the steps discussed above. Alternatively, the compliant layer 42 may be formed after the bonding process described below by injecting a curable elastomeric material such as silicone between the semiconductor element 40 and the central region 12 of the bonding component. The compliant layer also may be formed by providing a porous resilient layer between the tape and the chip so that the resilient layer supports the dielectric layer of the tape above the chip surface, and then injecting a curable liquid into the porous layer, as described in copending, commonly assigned U.S. patent application Ser. No. 08/365,699, filed Dec. 29, 1994, now U.S. Pat. No. 5,659,952, the disclosure of which is hereby incorporated by reference herein.

The individual leads 23 are bonded to bonding pads 41 on the semiconductor chip or wafer 40 using a bonding tool 43 (FIG. 6), such as a thermosonic bonding tool. The bonding tool is advanced downwardly into the bonding window or slot 10, deforming a lead 23 downwardly out of the plane of the dielectric tape 12, and into contact with a bonding pad 41 on the semiconductor element 40. The bonding operation may be generally similar to that disclosed in International Patent Publication WO 94/03036, U.S. Pat. No. 5,390,844 and U.S. Pat. No. 5,398,863, discussed above. Because the lead 23 is detached from the peripheral region 13 before the bonding operation begins, it is not necessary to detach the lead during the bonding operation.

Figure 6:
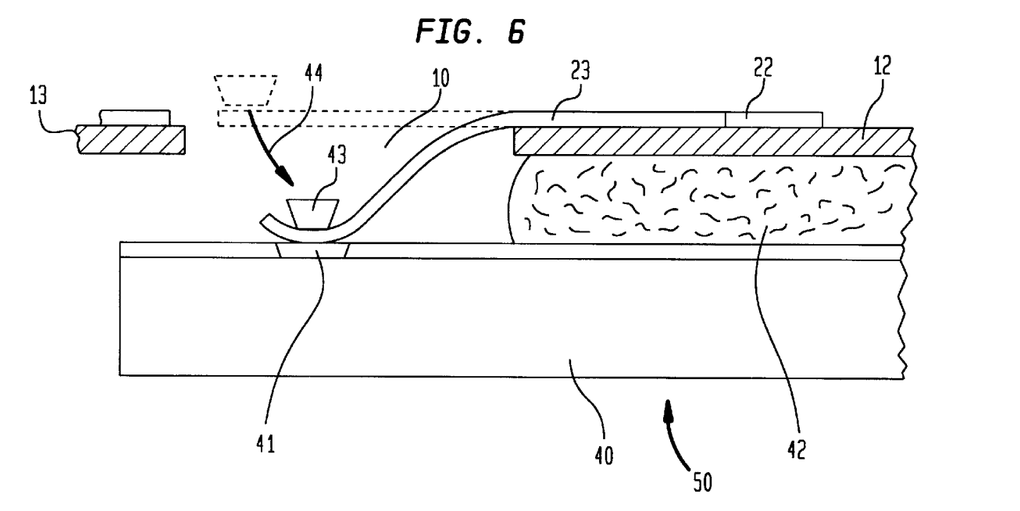
FIG. 6 is a partial sectional view of the component of FIGS. 1–5 together with a chip and resilient layer, during bonding process.

The bonding tool 43 may follow a path such as that shown by arrow 44, moving inward toward the central region 12 as it moves downward through the bonding window 10. In this way, tensile stresses on the lead 23 are minimized as the lead is displaced downwardly by the bonding tool 43. A single bonding tool may be used to bond each lead 23, one lead at a time, in sequence around the periphery of the central region 12.

The technique commonly referred to as "bumpless" bonding may be employed in the bonding operation. Because the leads have been plated with a bonding metal which is metallurgically compatible with the material of the chip contact, the leads 23 may be bonded to the contacts of the chip without the need to previously apply a bump of bonding material thereon. For example, a lead 23 plated with gold may be bonded directly to a gold chip contact without the need for a gold soldering bump on the chip contact. Bumpless bonding is disclosed, for example, in U.S. Pat. No. 3,777,365 and U.S. Pat. No. 4,842,662.

The semiconductor assembly, including the semiconductor element 40, the compliant layer 42, the central region 12 of the dielectric tape and the plurality of leads 23 (FIG. 6) is severed from the remaining portion of the tape. In one technique, a shear punch (not shown) is used to sever the semiconductor assembly from the tape along a line 38 immediately outside the bus structure 21 (FIG. 4).

In another embodiment of the invention, the semiconductor assemblies are self-singulating. For example, the bridges 15 (FIG. 4) may be severed so that the central region 12 of each unit, together with the chip attached to the leads, is separated from the remaining portion of the tape 1. In the case of metallic bridges, the bridges are separated from the central region 12 at the portion of the region where they were attached. The bridges are preferably separated after bonding the leads 23 to the semiconductor elements 40.

The resulting semiconductor assembly 50 (FIG. 6) includes the semiconductor element 40, the compliant layer 42, the central region 12 of the dielectric tape and the plurality of leads 23 connected at one end to the bonding pads 41 on the semiconductor element 40 and at the other end to terminals 22 on the dielectric central region 12. The semiconductor assembly 50 is now ready for bonding to a circuit board or other carrier or connection component. The compliance of the compliant layer 42 and the dielectric layer 12 reduces stresses in the bonds between the terminals 22 and bonding pads on the circuit board (not shown) due to thermally induced dimensional changes in the circuit board by the semiconductor element 40.

The plurality of slots 10 shown in FIG. 1 takes the form of four straight, elongated slots forming four sides of a trapezoidal central region 12. In this embodiment, the slots substantially surround the central region. As discussed, the bridges 15 are formed at the corners of the central region, between adjoining slots. In such an assembly having slots between about 0.10 and 0.25 inches long, bridges are about 0.01 to 0.08 inches in width.

Figure 11A:
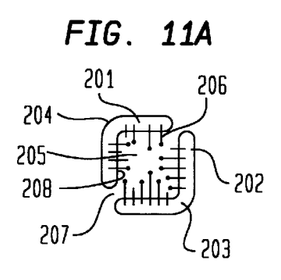
FIGS. 11A–11E are schematic plan views of alternate slot configurations according to other embodiments of the invention.

The slots may take other forms, such as the elbow slots 201, 202 shown in FIG. 11A. The elbow slots have corners 203, 204 and have inside, concave edges 208 defining a central region 205. These slots also substantially surround the central region. Bridges 207 connect the central region 205 with the peripheral region. Leads 206 extend from the central region partially across the slots.

Figure 11B:
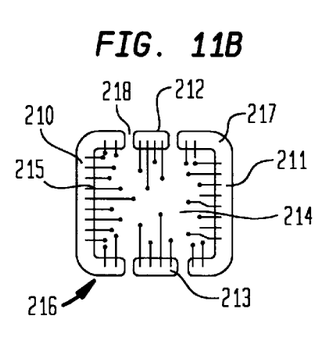

In an another embodiment shown in FIG. 11B, a rectangular slot 216 substantially surrounds a rectangular central region 214. The rectangular slot 216 is divided into separate segments 210, 211, 212, 213 by bridges 218 extending across the slot. The segments include two straight segments 212, 213 and two C-shaped segments 210, 211 with corners 217. The bridges 218 extend across the slots in locations between corners 217.

Figure 11C:
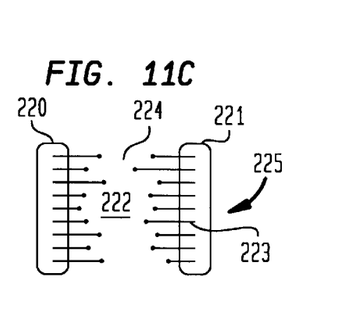

The slots may also partially surround the central region, as do the two straight, elongated slots 220, 221 shown in FIG. 11C. Those slots may be parallel to each other and define opposite sides of the rectangular central region 222. Bridges 224 between ends of the slots connect the central region 222 to the peripheral region 225 outside the slots. Leads 223 extend from the central region 222 partially across the slots.

Figure 11D:
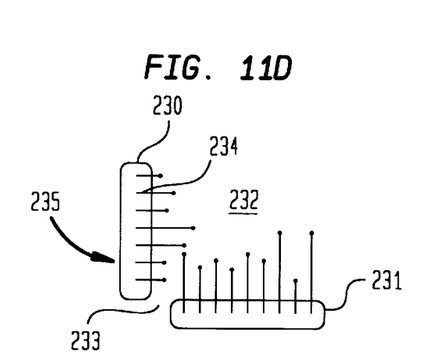

Two elongated slots 230, 231 (FIG. 11D) may also be arranged perpendicular to each other, defining a central region 232 between the slots. A bridge 233 connects the central region 232 with the peripheral region 235. Leads 234 extend from the central region 232 partially across the slots.

Figure 11E:
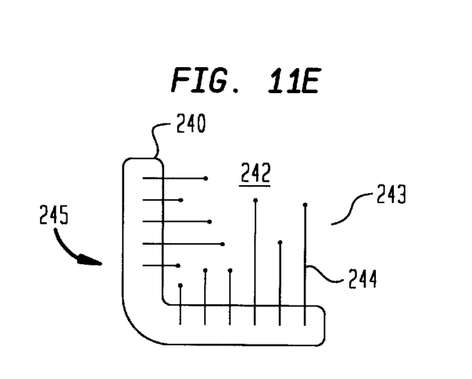

A single, elbow-shaped slot 240 (FIG. 11E) may partially surround the central region 242. In that case, a bridge area 243 connects the central region 242 with the peripheral region 245. Leads 244 extend from the central region 242 partially across the slot 240.

Figure 7:
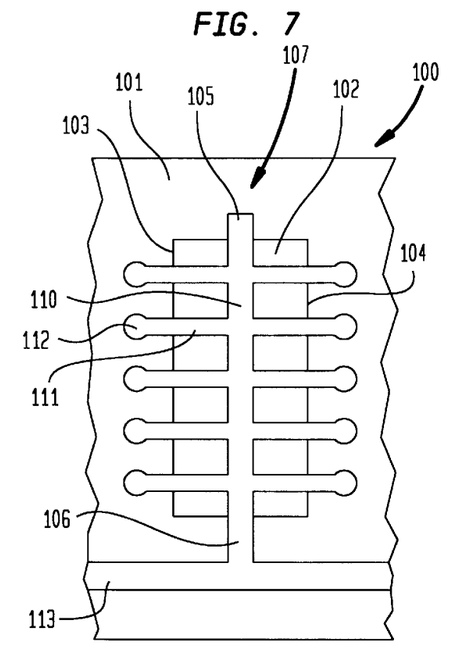
FIG. 7 is an enlarged plan view of part of a bonding tape according to another embodiment of the invention, during one step of a manufacturing process according to the invention.

In another embodiment of the invention, a bonding tape 101, shown in FIG. 7, has a series of units 100 spaced along the tape as described above. A central plating bus 110 extends lengthwise along the center of an aperture or slot 102 in the bonding tape 101. The plating bus 110 may be anchored to a surface of the dielectric bonding tape 101 in areas along the edges of the slot such as areas 105, 106. Each unit 100 further comprises a series of terminals 112 spaced around the periphery of the slot 102. A lead 111 extends from each terminal 112 to one of the edges 103, 104 of the slot 102, and further extends partially across the slot to the plating bus 105. The plating bus 105 thus electrically interconnects all of the terminals 112 and leads 111. The terminals 112, together with the leads 111 and the plating bus 106, comprise a metallic structure 107. The metallic structure is formed on the bonding tape 101 as described above. The metallic structure 107 may comprise the leads, terminals and plating buses of a plurality of units 100, interconnected by a plating bus interconnection 113.

In a subsequent step, a plating resist 120 (FIG. 8) is applied over the plating bus 110 in a zone separating each of the leads 111 from the other leads. As above, the resist 120 is applied using photographic or other techniques, and is resistant to electroplating. The plating resist may alternatively be restricted to small areas of the lead adjacent the plating bus in order to create zones isolating the leads.

Figure 8:
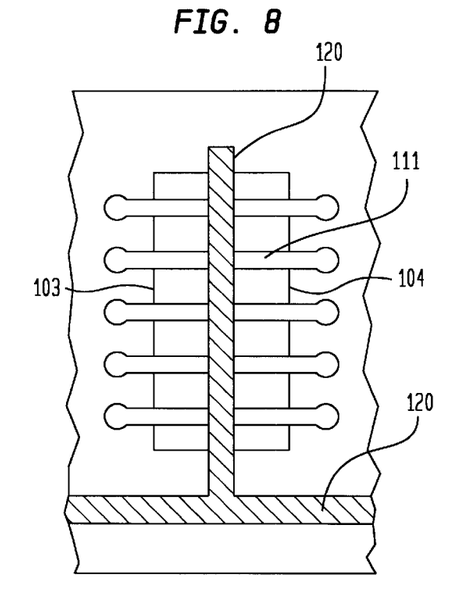
FIG. 8 is a plan view of the bonding component of FIG. 7 during a later step of the manufacturing process.

The leads and terminals, and any other portion of the metallic structure not covered with resist, is then plated with one or more metals which form an etch resistant, bondable covering as described above. The plating resist 120 is then removed, exposing the metallic structure in those areas formerly covered by the plating resist. The exposed portions of the metallic structure are then etched away, leaving the leads 111 unconnected to the plating bus or to the other leads. The leads 111 extend partially outwardly across one of the edges 103, 104 of the slot 102, and are cantilevered from those edges into the slot.

Figure 9:
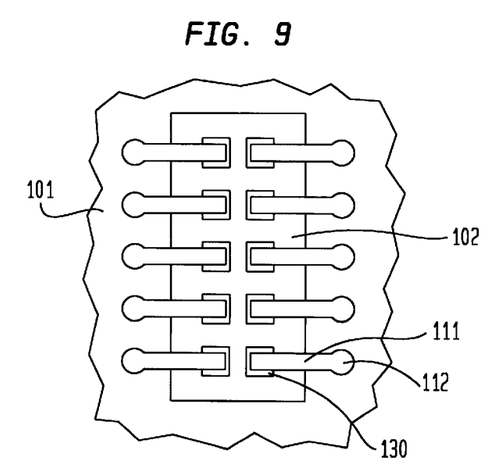
FIG. 9 is a plan view of the bonding component of FIG. 7 during a later step of the manufacturing process according to the invention.

The resulting bonding component is then ready for use as shown in FIG. 9. Each of the leads 111 may be bonded to a bonding pad 130 on a microelectronic component. The bonding pads 130 may be arranged in pairs as shown in FIG. 9 in order to accommodate pairs of leads 111 extending into the slot 102.

Figure 10:
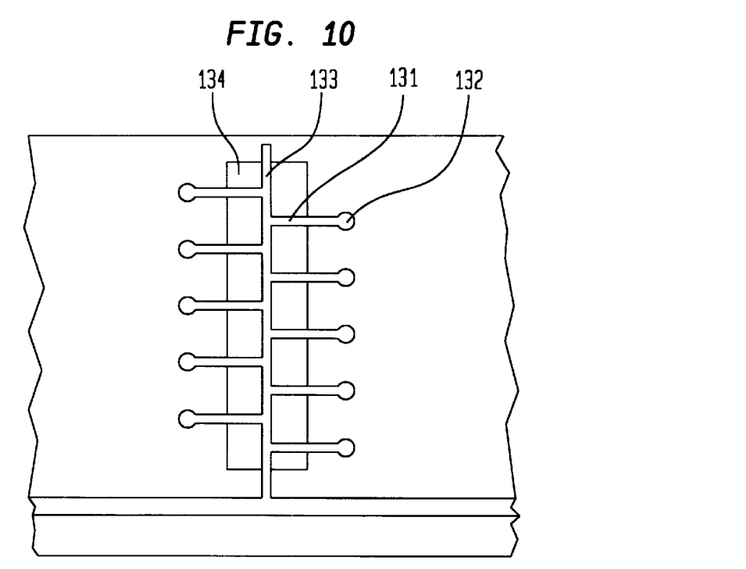
FIG. 10 is a plan view of an alternative embodiment of a bonding component according to the invention.

In another version of the invention, shown in FIG. 10, the leads 131 may extend alternately from one side and the other of the slot 134, joining a central plating bus 133. Such an arrangement is used to interconnect an electronic device having a single row of bonding pads (not shown), which is centered in the slot 134 before bonding. In other versions, the aperture may have a shape other than the slot shown in FIGS. 7–10. For example, the aperture may be round and the leads may extend radially inward over the aperture from terminals spaced around the aperture. The leads may be connected at the center of the aperture to a plating bus also extending from the edge. The center portion of this structure is etched away, leaving the leads unconnected to the plating bus or to other leads.

As will be readily appreciated, numerous variations and combinations of the features discussed above can be utilized without departing from the present invention as defined by the claims. Merely by way of example, in a variation of the above process for manufacturing a bonding component according to the invention, the metallic structure 20 may be plated, and the leads 23 may be severed before the elongated slots 10 are formed in the dielectric tape 1. In another variant, the dielectric layer may be in the form of a sheet adapted to cover an entire semiconductor wafer, and the units may be spaced in a grid pattern corresponding to the placement of individual chips on the wafer.

As these and other variations, combinations and modifications of the features discussed above can be employed without departing from the present invention, the foregoing description of the preferred embodiments should be taken by way of illustration rather than by way of limitation to the present invention as defined by the claims.

What is claimed is:

1. A bonding component for making semiconductor assemblies including:

(a) a dielectric layer having at least one slot in said dielectric layer;

(b) a central region of said dielectric layer defined by said at least one slot;

(c) a peripheral region of said dielectric layer outside said at least one slot;

(d) at least one bridge connecting the central region to the peripheral region;

(e) a plurality of terminals disposed on the central region; and (f) a plurality of leads extending from the terminals to the at least one slot, each of said leads extending partially across one of said slots so that each said lead is detached from the peripheral region and deformable by bending out of a plane of said dielectric layer.

2. The bonding component of claim 1, wherein said at least one slot comprises four straight, elongated slots forming four sides of a trapezoidal central region.

3. The bonding component of claim 1, wherein said at least one slot comprises two straight, elongated slots forming two sides of a trapezoidal central region.

4. The bonding component of claim 1, wherein said at least one slot comprises two straight, elongated slots extending parallel to each other and defining said central region therebetween.

5. The bonding component of claim 1, wherein said at least one slot comprises two elbow-shaped slots having concave edges defining said central region.

6. The bonding component of claim 1, wherein said at least one slot comprises a single rectangular slot having four corners and extending around a rectangular central region, wherein said bridges extend across said slot between said corners.

7. A bonding tape for making a plurality of semiconductor assemblies, said tape comprising a dielectric layer having a plurality of units, each said unit including:
   (a) a central region at least partially bounded by at least one slot in said dielectric layer;
   (b) a peripheral region disposed outside of the at least one slot;
   (c) at least one bridge connecting the central region to the peripheral region;
   (d) a plurality of terminals disposed on the central region; and
   (e) a plurality of leads extending from the terminals to the slots, each of said leads extending partially across one of said slots so that each said lead is detached from the peripheral region and deformable by bending out of a plane of said dielectric layer.

8. A tape as claimed in claim 7 wherein said dielectric layer is in the form of an elongated strip with said units spaced apart from one another along the length of the strip.

9. A bonding component for making semiconductor assemblies including:
   (a) a dielectric layer having a plurality of slots in said dielectric layers;
   (b) a central region of said dielectric layer substantially surrounded by said slots;
   (c) a peripheral region of said dielectric layer disposed outside said slots;
   (d) at least one bridge connecting the central region to the peripheral region;
   (e) a plurality of terminals disposed on the central region; and
   (f) a plurality of leads extending from the terminals to the slots, each said lead extending partially across one of said slots so that each said lead is detached from the peripheral region and deformable by bending out of a plane of said dielectric layer.

10. A method of making a connection component for a semiconductor assembly comprising the steps of:
    (a) providing a dielectric layer having a central region, one or more slots disposed adjacent the central region and a peripheral region disposed adjacent the slots opposite the central region;
    (b) providing a metallic structure including a plurality of terminals disposed on said central region, one or more plating bus runs disposed on said peripheral region, and leads extending from said terminals to said plating bus runs;
    (c) applying a resist to said leads in zones adjacent said plating bus runs and plating regions of said leads outside of said zones with an etch-resistant metal; and
    (d) removing said resist and etching said leads so as to form gaps in said leads.

11. A method as claimed in claim 10 wherein said steps of applying said resist and etching are performed so that said gaps in said leads are aligned with said one or more slots.

12. A method as claimed in claim 11 wherein said gaps in said leads are aligned with outside edges of said one or more slots, so that after formation of said slots and gaps each lead extends from the central region partially across a slot to one said gap.

13. A method as claimed in claim 10 wherein said one or more slots surround said central region, said dielectric layer having bridges disposed between the slots connecting the central region to the peripheral region.

14. A method as claimed in claim 13 wherein said plating bus runs alongside said one or more slots.

15. A method as claimed in claim 13 wherein said dielectric layer includes a plurality of units, each including a central region and peripheral region as aforesaid, and wherein said metallic structure includes terminals on the central region of each said units, leads associated with the terminals of each said unit and one or more plating bus runs on the peripheral region of each said unit.

16. A method as claimed in claim 15 wherein the plating bus runs on the peripheral regions of said plural units are connected to one another, and wherein said plating step is performed on the leads of a plurality of units simultaneously.

17. A method of forming a semiconductor connection component comprising the steps of:
    (a) providing a dielectric layer with a slot therein;
    (b) providing a metallic structure including terminals disposed on the dielectric layer on one side of the slot, a plating bus line disposed on the other side of the slot, and leads extending from the terminals across the slot to the plating bus;
    (c) applying resist to said leads in zones adjacent to said plating bus;
    (d) plating the leads with a bonding material using the plating bus to conduct plating current to the leads, the plating step depositing the bonding material at least on portions of the leads aligned with the slot; and
    (e) removing said resist and etching said leads in said zones to form gaps.

18. A method as claimed in claim 17 wherein said steps of applying said resist and etching are performed so that said gaps in said leads are aligned with said slots.

19. A method of making a connection component for a semiconductor assembly comprising the steps of:
    (a) providing a dielectric layer;
    (b) forming an aperture in said dielectric layer;
    (c) providing a metallic structure including a plurality of terminals disposed on said dielectric layer, a plurality of leads connected to said terminals and extending at least partially across said aperture, and a plating bus interconnecting each lead of said plurality of leads;
    (d) applying a resist to said metallic structure such that each lead is separated from the others by a zone covered by said resist;
    (e) plating regions of said leads not covered by said resist; and
    (f) removing said resist and etching unplated regions of said metallic structure to form gaps in said metallic structure and to disconnect said leads from one another.

20. A method as claimed in claim 19 wherein said step of providing said metallic structure is performed so that said plating bus extends at least partially over said aperture.

21. A method as claimed in claim 19 wherein said step of applying said resist is performed so that said zone includes said bus.

22. A method as claimed in claim 21 wherein after etching said metallic structure each said lead extends partially across said aperture.

23. A method as claimed in claim 19 wherein said dielectric layer includes a plurality of units, each including an aperture as aforesaid, and wherein said metallic structure includes terminals within each of said units, leads associated with the terminals of each said unit and one or more plating bus runs interconnecting the leads of each said unit.

24. A method as claimed in claim 23 wherein the plating bus runs of said plural units are connected to one another, and wherein said plating step is performed on the leads of a plurality of units simultaneously.

25. A bonding component for making semiconductor assemblies, including:
- (a) a dielectric layer having a top surface with first and second regions on opposite sides of an aperture in said dielectric layer;
- (b) a plurality of terminals disposed on said first region; and
- (c) a plurality of leads having first ends on said first region connected to said terminals and having second ends extending in a plane of said top surface partially across said aperture;

wherein said leads are plated by a process of applying a plating current through a temporary connection between said second ends of said leads and a plating bus on said second region, and then removing said temporary connection.

* * * * *